United States Patent [19]

Spohr

[11] 4,369,370

[45] Jan. 18, 1983

[54] METHOD FOR PRODUCING NUCLEAR TRACES OR MICROHOLES ORIGINATING FROM NUCLEAR TRACES OF AN INDIVIDUAL ION

[75] Inventor: Reimar Spohr, Darmstadt, Fed. Rep. of Germany

[73] Assignee: Gesellschaft fur Schwerionenforschung mbH Darmstadt, Darmstadt, Fed. Rep. of Germany

[21] Appl. No.: 219,351

[22] Filed: Dec. 22, 1980

[30] Foreign Application Priority Data

Dec. 20, 1979 [DE] Fed. Rep. of Germany ....... 2951376

[51] Int. Cl.³ .............................................. H01J 23/00
[52] U.S. Cl. ..................................... 378/160; 328/233
[58] Field of Search ............ 250/396, 397, 398, 492.2, 250/423 R, 514, 503, 505; 328/233

[56] References Cited

U.S. PATENT DOCUMENTS 3,725,797 4/1973 Masuda .............................. 328/233
4,229,704 10/1980 Lewis .................................. 328/233

OTHER PUBLICATIONS

"Unilac, The Accelerator Facility for Heavy Ions of the GSI", *Kerntechnik 19, Jahrgang,* (1977), No. 2, Angert et al.

*Primary Examiner*—Bruce C. Anderson
*Attorney, Agent, or Firm*—Spencer & Kaye

[57] ABSTRACT

Method for producing nuclear traces, or microholes originating from nuclear traces, from a single ion or a countable number of ions in a solid body by means of an accelerator, e.g. heavy ions in a heavy ion accelerator. A widened or attenuated beam or ions is directed onto the surface of a solid body via a preliminary aperture to cut out any non-required particles. The impinging of an individual particle, after or before passage through the solid body, is determined directly and depending of this determination, other particles which might possibly pass through the aperture are prevented from doing so.

11 Claims, 2 Drawing Figures

METHOD FOR PRODUCING NUCLEAR TRACES OR MICROHOLES ORIGINATING FROM NUCLEAR TRACES OF AN INDIVIDUAL ION

BACKGROUND OF THE INVENTION

The present invention relates to a method for producing nuclear traces, or microholes originating from nuclear traces, of an individual ion or a countable number of ions in solid bodies by means of an accelerator, e.g. heavy ions in a heavy ion accelerator, with a defocused or attenuated beam and with elimination of the non-required particles.

The method proposed here relates to the production of the very finest individual holes in solid bodies and in particular organic foils, glasses and thin dielectric crystals. For certain purposes it is desired to produce holes of a heretofore unachieved smallness, i.e. with a hole diameter down to $0.01\mu$, in a reproduceable manner. It is further desirable to have a ratio of hole diameter to hole length up to 1:1000.

Individual holes in foils can be produced by mechanical means with lasers, with electron beams, by means of photo or X-ray lithography, as well as with the aid of fiber bonding techniques. Moreover, it is known to produce a single hole membrane from unirradiated mica foils. In this case, one takes advantage of the fact that natural mica contains a few latent nuclear traces from the uranium which is contained therein in low concentration and undergoes spontaneous fission. After etching of the mica foils to expose the nuclear trace holes, a nuclear trace suitable for the desired hole is selected. The nonrequired nuclear trace holes, however, must subsequently be sealed off.

If one does not consider the other methods whose hole diameter to length ratio is a minimum of 1:100, only the nuclear trace technique makes it possible to produce holes smaller than $0.1\mu$ with a hole diameter to length ratio down to 1:1000. The drawbacks in sealing all the other nuclear trace holes after searching out or selecting a single, suitably placed nuclear trace hole are as follows:

1. The size of the hole must be large enough to be made visible.
2. It is very difficult to localize individually placed holes which are smaller than $1\mu$ in a light or electron microscope.
3. Micromanipulation is required to seal the remaining holes, for example, with an adhesive.
4. If one limits oneself to very thinly irradiated foils whose total surface contains only one hole on the statistical average, there arises the necessity, due to the statistical spread, of subjecting each individual foil to a quality control to determine whether 0.1 or 2 or 3 holes are present on the respective foil.
5. The hole cannot be placed into the center of the foil or at the most suitable spot on the foil in a directed manner.
6. It is impossible to simultaneously produce several foils each having a single hole.

SUMMARY OF THE INVENTION

It is now the object of the present invention, based on this state of the art, to provide a method which makes it possible to produce one or a plurality of countable nuclear traces in a solid body in a directed manner and without having to make a selection from a plurality of traces. Moreover, it should be possible to apply the nuclear traces at defined locations.

The above object is basically achieved according to the present invention, in that a defocused beam of ion particles is directed onto a surface of a solid body via an aperture aligned with a location on the surface of the solid body which it is desired to irradiate with an ion; the impingement of an individual ion particle after or before passage through the solid body is determined directly; and, at the same moment, and depending on this determination, other ion particles which could possibly pass through the aperture and impinge on the solid body are prevented from doing so. Preferably this is achieved by blocking the ion beam. After the irradiation, the solid body is subjected, in a known manner, to an etching process to expose the microholes associated with the nuclear traces.

According to one embodiment of the present invention, the signal from a detector for detecting individual particles, which detector is disposed in the beam path either ahead of or behind the target sample and indicates the impingement of the ion particles, is used to actuate the turn-off or blocking process of the ion beam. A particularly advantageous feature of this embodiment of the invention is that the turn-off or blocking process is initiated by an initial actuation of a fast beam turn-off switch or shutter for the entire beam, which shutter is disposed in the slow portion of the beam path, that thereafter a slower but more stable switch or shutter, disposed in the beam path behind the first shutter and in the portion of the beam required for the irradiation, is actuated and that thereafter the first shutter is opened again.

The present invention further discloses an apparatus which is particularly suitable for performing the novel method including a heavy ion accelerator having an ion beam which impinges on the surface of a solid body through a preliminary aperture, a detector for individual ion particles which, depending on the thickness of the solid body, is disposed in the beam path in front of or behind the solid body and whose signals actuate an electrostatic or electromagnetic aperture or shutter acting as a first fast beam cut-off switch in the upstream slow portion of the beam path, and simultaneously, or after a defined period of time, actuate a second, slower beam cut-off switch e.g. a cooled Faraday cup, in the downstream, diverted portion of the beam path.

According to an advantageous modification of the present invention the first fast beam cut-off switch is released to open in dependence on the closing of the second switch to block the beam. Moreover, according to a particularly advantageous feature, the preliminary aperture is an already completely fabricated single-hole membrane provided with a microhole.

The method according to the invention is particularly advantageous in that it permits the series production of single-hole membranes in an ion accelerator in an economic manner e.g. in a second or diverted beam path which is not being used experimentally or in the unutilized waste beam downstream of other nuclear physical experiments. Moreover, the above-mentioned drawbacks and problems are avoided.

DETAILED DESCRIPTION OF THE PREFERRED EMBODIMENTS

Figure 1:
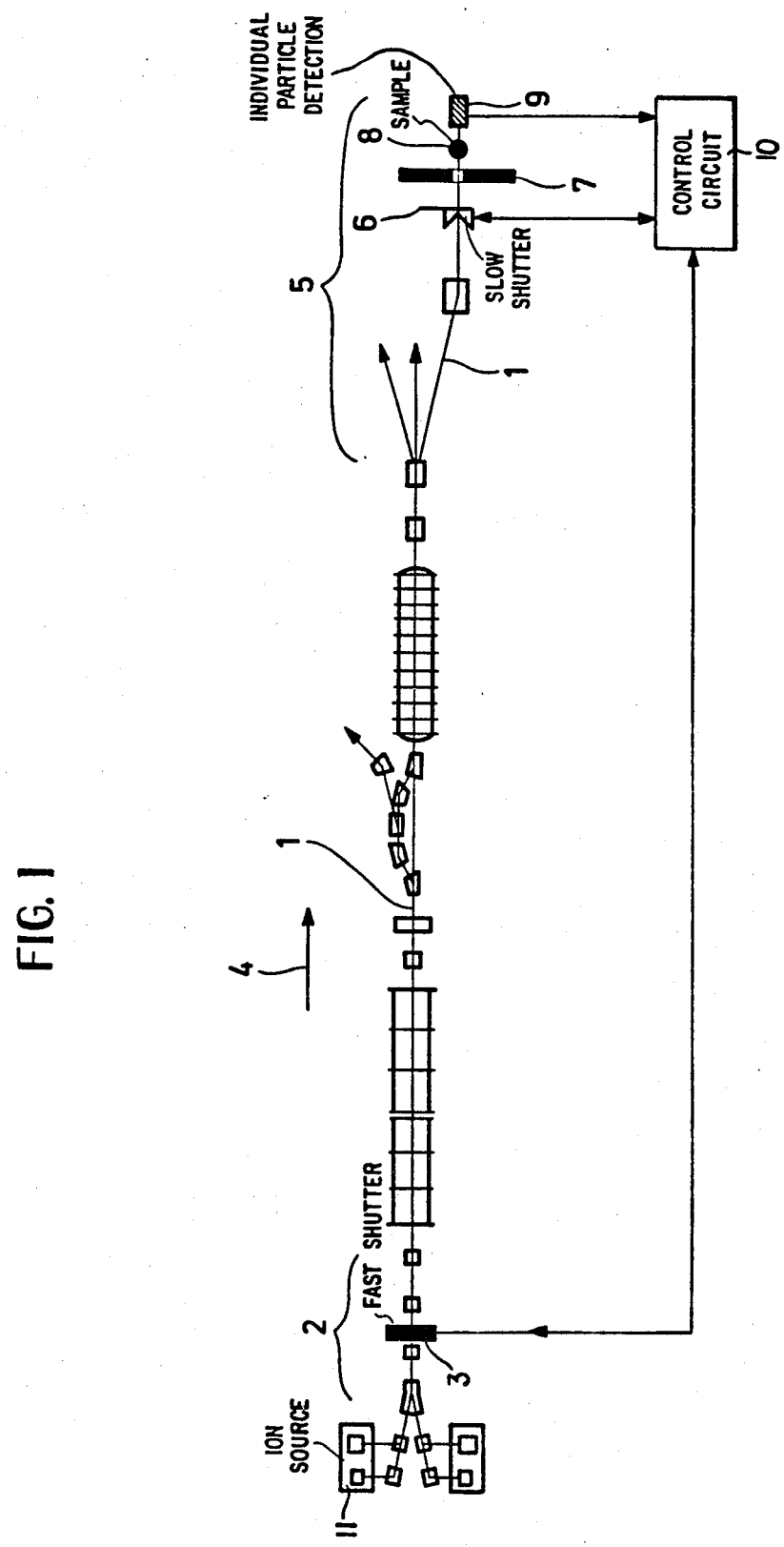
FIG. 1 is a schematic representation of the beam path of a heavy ion accelerator used to carry out the method according to the invention.

Turning now to FIG. 1, there is a schematic and simplified representation of the beam path 1 of a heavy ion accelerator with which the method according to the invention is performed, the beam travelling in the direction 4. A fast, i.e. preferably electrostatic or electromagnetic, shutter 3 which, however, can handle only a relatively small load is connected in the slow, i.e. upstream, portion of the beam path 1 in addition to other elements which are not significant for the invention and will not be explained in detail below. The downstream, faster portion 5 of the beam 1 includes, after a plurality of acceleration sections, deflections and apertures (illustrated schematically), a further, slower shutter 6, preferably a cooled Faraday cup, which can withstand a sufficiently greater load and which is capable of absorbing the beam 1 over a longer period of time. Behind this shutter 6, again seen in the direction 4, there is provided an aperture plate having a preliminary aperture 7 followed by the sample 8 to be irradiated. Finally, immediately behind the sample 8, there is provided a particle detector 9 to detect individual particles. Alternatively, for certain uses, the particle detector 9 may be provided directly ahead of the sample 8. An accelerator of that type is described in: KERNTECHNIK Vol. 19, (1977), No. 2, p. 57-66, in an article by N. Angert et al entitled "Unilac, the accelerator facility for heavy ions of the GSI."

The detector can be placed either in front of the sample (for thick samples, since no particles can be detected behind the sample) or behind the sample (for thin samples; prefered, if the transmitted ion generating the latent track is transmitted through the sample with sufficient rest energy to be detected).

The process performed with the above-described accelerator device now operates as follows and will be explained in several steps with the aid of an embodiment.

1. Five foils, each approximately 20μ thick are cut out in circular shapes and placed into a corresponding recess of a sample holder (not shown) and are thus simultaneously centered. A preliminary aperture plate 7 having a circular aperture with a diameter of about 0.3 mm defines the centrally disposed region of the foils through which it is desired that the ion beam will pass. The aperture plate 7 and the foil or foils 8 are connected with the sample holder so as to be simultaneously tight and immovable by means of a latching clamping ring (not shown).

2. The high energy ion beam 1, e.g. here 7.5 MeV/$U^{238}$ uranium of a heavy ion accelerator of the UNILAC type, is widened, and thus simultaneously weakened or attenuated by defocussing magnetic lenses while being simultaneously viewed by means of a fluorescent screen with a series connected image amplifier television camera until the fluctuations are visible to the human eye.

A given ion energy corresponds to a certain range of the ion in solid matter.

Beam widening (equivalent to defocussing) is monitored via a fluorescent screen. If no fluorescent screen or other low intensity detecting x/y-sensitive detector is used during such a procedure, the beam may, get lost through deflection to the wall of the accelerator beam line.

A specific ion (Argon through Uranium) energy of 1.4 MeV/nucleon (10 MeV/nucleon) corresponds to an approximate range of 10 μm (100 μm) in solid matter. The ion beam must be widened or defocused (which is equivalent) in order to decrease its intensity to such an extent that a sufficiently small number of heavy ions penetrates through the aperture plate per second. A fast shutter system thereby enables a precise large Number N of particle tracks to be created in the sample. A slow shutter system at the same intensity level however, would yield only on the average a certain number N of tracks. Individual irradiations, however, would scatter around this value with a statistical error of $\sqrt{N}$.

3. The ion beam 1 or at least the diverted portion of same containing the sample 8 is then switched off. The sample holder with the sample 8 is brought into the beam path by means of a lock-in device (not shown) of conventional design and the fluorescent screen is replaced by a semiconductor particle detector 9 attached behind the foil or sample 8 as indicated.

4. Thereafter, the ion beam 1 is switched on again or unblocked and one waits until a single ion, or if more than one trace is desired, a predetermined countable number of ions, has travelled through the preliminary aperture 7 and the five foils 8 to impinge on the detector 9 which detects individual ions and produces a signal corresponding to same. This signal is fed to an electronic control system 10 which includes a main amplifier and a single channel discriminator and which, in response to detection of a predetermined number of ion particles, activates the electrostatic shutter 3 to initiate the turn-off or blocking process of the ion beam 1.

5. Since the fast electrostatic shutter 3 immediately cuts off the beam 1 but is able to fully absorb the beam power only for a very short time and since it moreover switches off the entire main beam, the slow shutter or cut-off switch 6 disposed in the shunt or diverted path, i.e. in the fast or accelerated portion of the beam 1, is actuated immediately and as soon as it is closed, the shutter 3 is opened. Due to the construction of the shutter 6, for example, if it is a cooled Faraday cup, it is able to absorb the entire radiated power.

6. During the time the ion beam 1 is blocked by the shutter 6, the clamping ring with the sample 8 is moved out of the beam path again and the sample or foil, is removed.

7. The foils or solid bodies, respectively, which now contain the applied individual nuclear traces are etched with appropriate etching means until the microhole or holes have been exposed and have reached the desired diameter.

The ion beam 1 can be the more intensive the faster the "illumination shutter" operates, i.e., the faster the two switches or shutters 3 and 6 cooperate. As already described, the illumination shutter includes a slow mechanical shutter 6 which is disposed directly in front of the foil or sample 8 to be irradiated and which serves to suppress the stray particles which always impinge with weak intensity, and a fast electrostatic or electromagnetic shutter 3 which is disposed in the injector region of the accelerator directly behind the ion sources 11. This electrostatic shutter 3 at this location can still be operated with relatively low voltages of a few kV since the ions are still rather slow there and can therefore have a very rapidly rising or falling voltage profile.

By a suitably phased interaction of the two shutters, cut-off switches or attentuators 3 and 6, very short irradiation periods of, e.g. a few msec to a few usec, become possible and this without significantly interfering with the other work of the accelerator since the beam 1, due to the phased interaction of the two shutters 3 and 6, need only be cut off completely by the electrostatic shutter, i.e. be unavailable for all other experiments with the accelerator, during the switching time of the relatively slow shutter 6. That is, after closing of the shutter 6, the shutter 3 immediately opens. The mechanical shutter 6 is advantageously provided in the form of a Faraday cup having a switching time of about 0.5 seconds which can be supplemented by a cooperating electromechanic photographic shutter having a switching time of less than 0.01 second.

Figure 2:
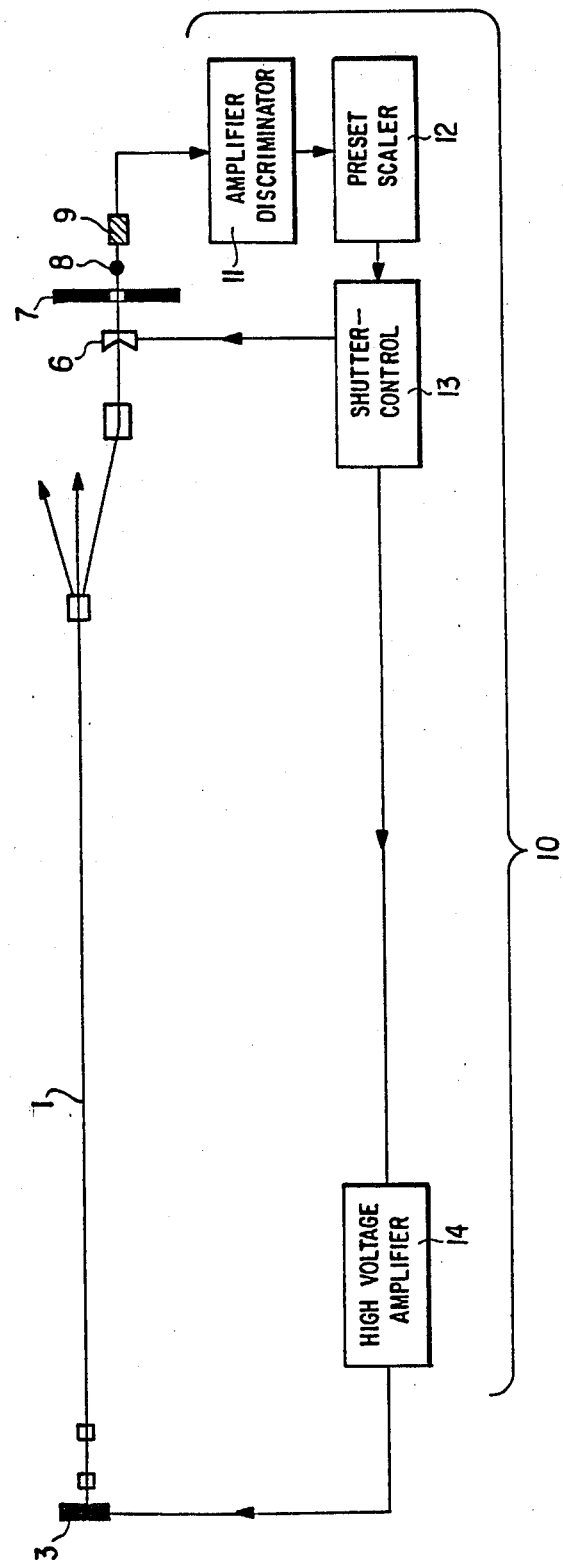
FIG. 2 shows, in block diagram form, a circuit necessary to control the shutters in the manner according to the invention.

FIG. 2 shows a block diagram forming the circuit necessary to control the shutters. For the same parts as in FIG. 1, the same reference numbers are used. The shutter control circuit 10 consists of:

(a) amplifier and discriminator 11;

(b) preset scaler 12, set to the desired number of particle tracks;

(c) shutter control 13 for activation of the slow shutter 6 and the fast shutter 3 in such a manner that the accelerator beam 1 can be utilized maximally at other experiments, whereby long term shutting off of the beams from the sample is provided by the local "slow" shutter 6; and (d) high voltage amplifier 14 for rapid deflection of the heavy ion beam at the fast shutter 3.

In summary, the significant novelty of the proposed method resides in the following points:

1. One or a plurality of foils or solid bodies, respectively, depending on the energy and type of the particles of the ions employed, can be perforated simultaneously at a point determined by the preliminary aperture.

2. By using an irradiation detector inserted between the preliminary aperture and the foil the method can also be applied to thicker, nonirradiatable samples and its field of application can thus be broadened considerably.

3. The method permits the precise prior selection of the location to be irradiated or to be exposed to radiation by means of a preliminary aperture 7.

4. By using a completely fabricated single hole membrane as the preliminary aperture, the point of perforation for further series irradiations can be fixed with great precision thus permitting substantially identical replicas.

5. Due to the use of the double shutter system, single hole irradiations can be performed very reliably without significantly interfering with the other operation of the accelerator.

6. The method permits the reliable series production of single hole structures or multi-hole structures with a accurately predictable number of holes in that it is now possible to use one or a plurality of individual particles to produce a desired effect.

The following is an example of a device produced according to the invention: A single pore membrane with about 5 μm hole diameter can be used to determine the rigidity of individual red blood cells (diameter about 8 μm). To obtain a hole in a membrane of 10 μm thickness, at least a specific energy of the heavy ion penetrating it of about 1 MeV/nucleon is required. The material of the membrane can be, e.g., a polycarbonate foil. The foil diameter is 50 mm, and the aperture 7 covers the foil disk completely (>50 mm). The number of tracks in the foil is exactly one. Etching is done in this case with normal NaOH with 10% ethanol at 40° Centrigrade.

It is to be understood that the above description of the present invention is susceptible to various modifications, changes and adaptations, and the same are indended to be comprehended within the meaning and range of equivalents of the appended claims.

What is claimed is:

1. Method for producing at least one nuclear trace, or a microhole originating from a nuclear trace, of a single ion or a countable number of ions at a desired location in a solid body by means of a beam of heavy ions in a heavy ion accelerator comprising the steps of:

directing a defocused portion of a beam of accelerated ions onto a surface of a solid body via an aperture aligned with a desired location on the surface of said body; directly detecting the number of individual ion particles passing through said aperture and impinging on said body; and preventing other ion particles from passing through said aperture when a predetermined number of individual ion particles is detected by:

initially blocking the entire beam by actuating a fast acting beam cut-off switch disposed in the slow portion of the beam path; thereafter actuating a slower acting beam cut-off switch, which is able to receive greater beam energies than the first switch and is disposed in the beam path behind the first switch and in said defocused portion of the beam path, to block said defocused portion of the beam path; and thereafter opening the first switch.

2. A method as defined in claim 1 further comprising etching said solid body, after irradiating of same with the predetermined number of individual ion particles, to expose the resulting nuclear trace and produce a microhole.

3. The method defined in claim 1 wherein said step of directly detecting includes disposing an individual ion detector behind said body to detect the number of individual ion particles passing through said body.

4. The method defined in claim 1 wherein said step of directly detecting includes disposing an individual ion detector between said aperture and said body to detect the number of impinging individual ion particles before they pass through the solid body.

5. The method defined in claim 1, 3 or 4 wherein said predetermined number is one.

6. Apparatus for producing at least one nuclear trace of a single ion or a countable number of ions at a desired location in a solid body by means of heavy ions including: a heavy ion accelerator having a locus for the solid body disposed in a downstream diverted portion of its beam path for impingement by same; a preliminary aperture disposed in said diverted downstream portion of said beam path in front of said locus for the solid body; detector means disposed adjacent said locus for the solid body for detecting individual ion particles passing through said aperture and impinging on the solid body and for providing a signal corresponding to the number of detected individual ion particles; a first fast acting electrostatic or electromagnetic shutter disposed in the upstream slow main portion of said beam path; a second slower shutter, which is able to receive greater beam energies than said first shutter, disposed in said downstream, diverted portion of said beam path; and means responsive to the signal from said detector means indicating the detection of a predetermined number of ion particles for actuating said first shutter to close same, and for simultaneously actuating said second shutter to close same.

7. Apparatus as defined in claim 6 wherein said second shutter is a Faraday cup.

8. Apparatus as defined in claim 6 wherein said means for actuating includes means for releasing said first shutter to open same when said second shutter has closed.

9. Apparatus as defined in claim 6 wherein said preliminary aperture is an already completely fabricated single hole membrane having a microhole.

10. The apparatus defined in claim 6 wherein said detector means is disposed in front of the solid body.

11. The apparatus defined in claim 6 wherein said detector means is disposed behind the solid body.

* * * * *